(12) United States Patent
Hiramoto et al.

(10) Patent No.: US 7,294,780 B2
(45) Date of Patent: Nov. 13, 2007

(54) PHOTOELECTRIC CURRENT MULTIPLIER USING MOLECULAR CRYSTAL AND PRODUCTION METHOD THEREFOR

(75) Inventors: Masahiro Hiramoto, Osaka (JP); Masaaki Yokoyama, Hyogo (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 11/589,796

(22) Filed: Oct. 31, 2006

(65) Prior Publication Data

US 2007/0042523 A1    Feb. 22, 2007

Related U.S. Application Data

(62) Division of application No. 10/490,476, filed on Mar. 24, 2004, now Pat. No. 7,220,986.

(30) Foreign Application Priority Data

Sep. 28, 2001  (JP)  ............................. 2001-301575
Feb. 4, 2002   (JP)  ............................. 2002-27437

(51) Int. Cl.
   *H01L 31/00*   (2006.01)
(52) U.S. Cl. ........................ 136/256; 257/40
(58) Field of Classification Search ............... 136/256; 257/40, 431, 436, 439, 448; 313/532, 504
   See application file for complete search history.

(56) References Cited

U.S. PATENT DOCUMENTS 5,170,238 A    12/1992  Sakai et al.

FOREIGN PATENT DOCUMENTS

| EP | 0 330 395 A1 | 8/1989 |
|---|---|---|
| JP | 52-137432 | 11/1977 |
| JP | 01 214078 | 8/1989 |
| JP | 06 244113 | 9/1994 |
| JP | 06 291065 | 10/1994 |
| JP | 07-011425 | 1/1995 |
| JP | 07-033438 | 2/1995 |
| JP | 11 329736 | 11/1999 |
| JP | 2000 345321 | 12/2000 |

OTHER PUBLICATIONS

International Search Report for PCT/JP02/07822, Nov. 12, 2002.
International Preliminary Examination Report for PCT/JP02/07822, Sep. 3, 2003.

(Continued)

*Primary Examiner*—Sara Crane
(74) *Attorney, Agent, or Firm*—Rader, Fishman & Grauer PLLC

(57) ABSTRACT

A NTCDA single crystal is used as a photoelectric current multiplier layer, and Au thin films are formed as electrodes on the opposite surfaces of the multiplier layer by a vapor deposition method to form a sandwich type cell. When a voltage is applied to the NTCDA single crystal by the electrodes from a dc power source and a monochromatic light is applied, a multiplied photoelectric current flows between the electrodes. A rise of this element at light-on is considerably faster than when a vapor-deposited layer is used as a photoelectric current multiplier layer to permit a faster response.

8 Claims, 14 Drawing Sheets

OTHER PUBLICATIONS

H. Kallman et al., "Symposium on Electrical Conductivity in Organic Solids", pp. 21-25, Duke University, Durham, North Carolina, Apr. 20-22, 1960.

T. Katsume et al., "Photocurrent multiplication in naphthalene tetracarboxylic anhydride film at room temperature", Applied Physics Letters, vol. 69, No. 24 (Dec. 9, 1996), pp. 3722 to 3724.

M. Hiramoto et al., Loght Amplification in a New Light Transducer Combining an Organic Electroluminescent Diode with Photoresponsive Organic Pigment Film, Optical Review, vol. 1, No. 1 (1994), pp. 82-84.

M. Hiramoto et al, "Photocurent Multiplication in Molecular Crystals-Molecular Blind Alley Model" Technical Report of IEICE, Aug. 27, 2001.

M. Yokoyama, "Molecular-scale Structure Control of the Organic THin Film/Metal Interface and Photocurrent Multiplication-type Photo-sensing Device", Symposium of Quantum Effect and Related Physical Phenomena, Dec. 18, 2001.

Japanese Office Action dated Feb. 20, 2007 for corresponding Japanese Patent Application No. 2002-027437.

Interfacial hole traps

Fig.3
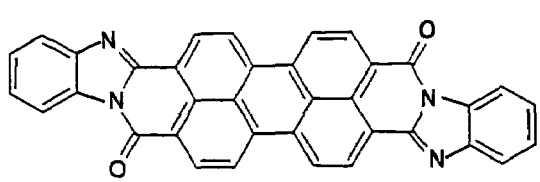
Im-PTC
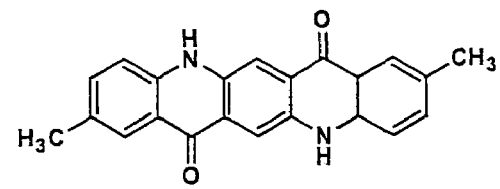
DQ
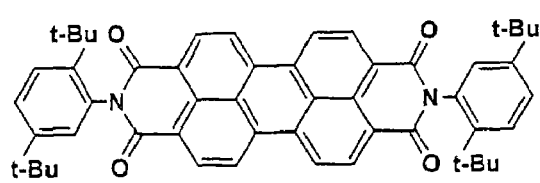
t-BuPh-PTC
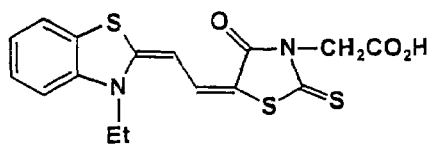
merocyanine
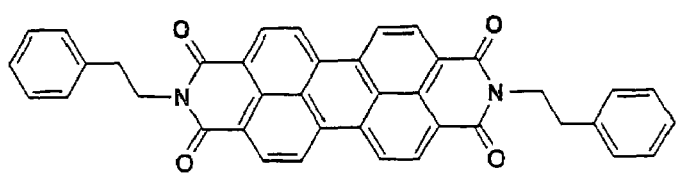
PhEt-PTC
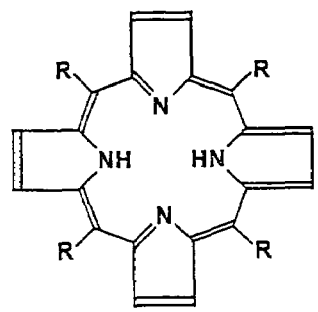
porphyrin backbone
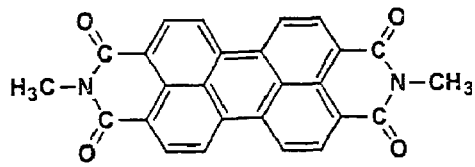
Me-PTC
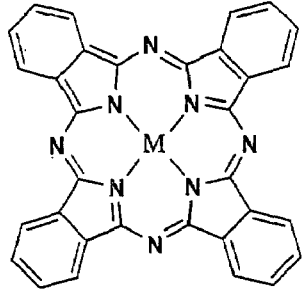
MPc
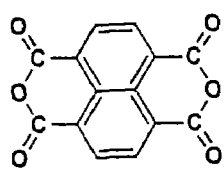
NTCDA
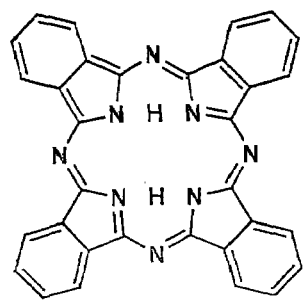
H2Pc Fig.4
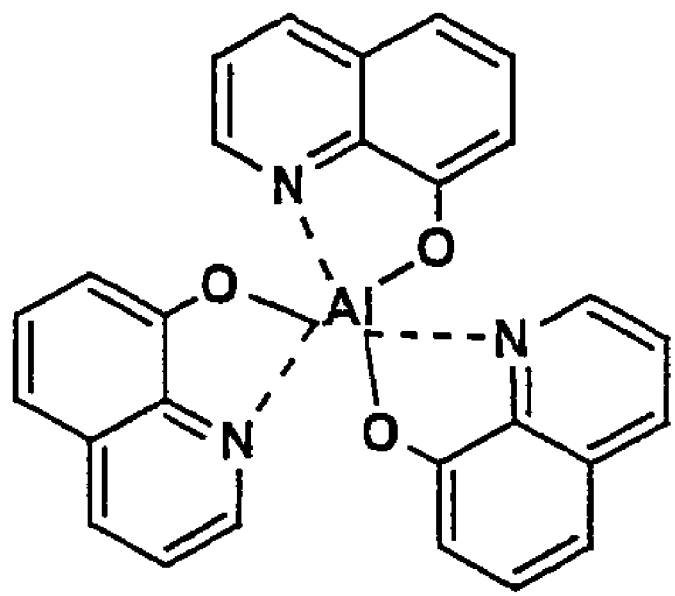
C20
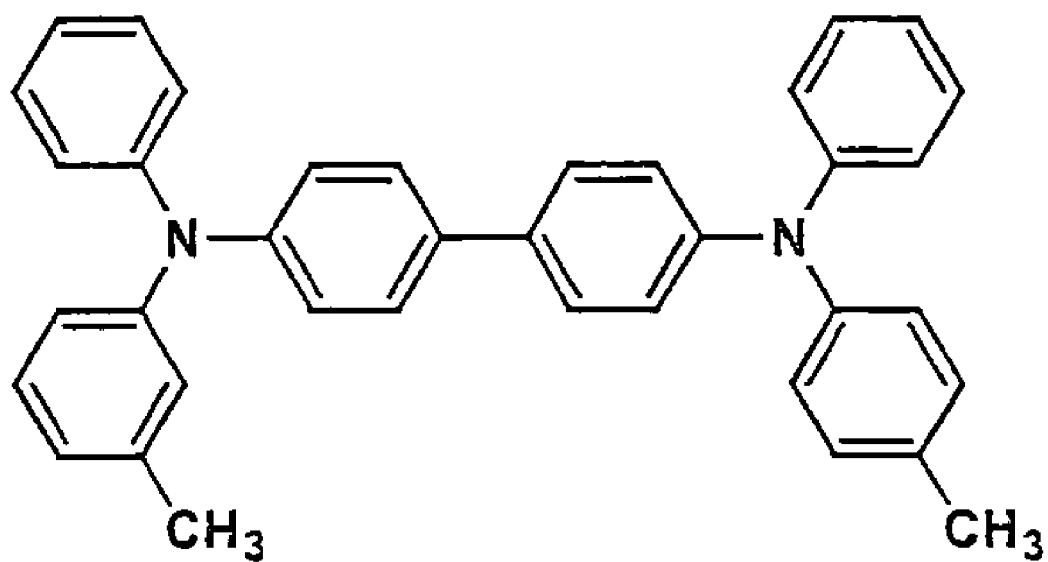
C21

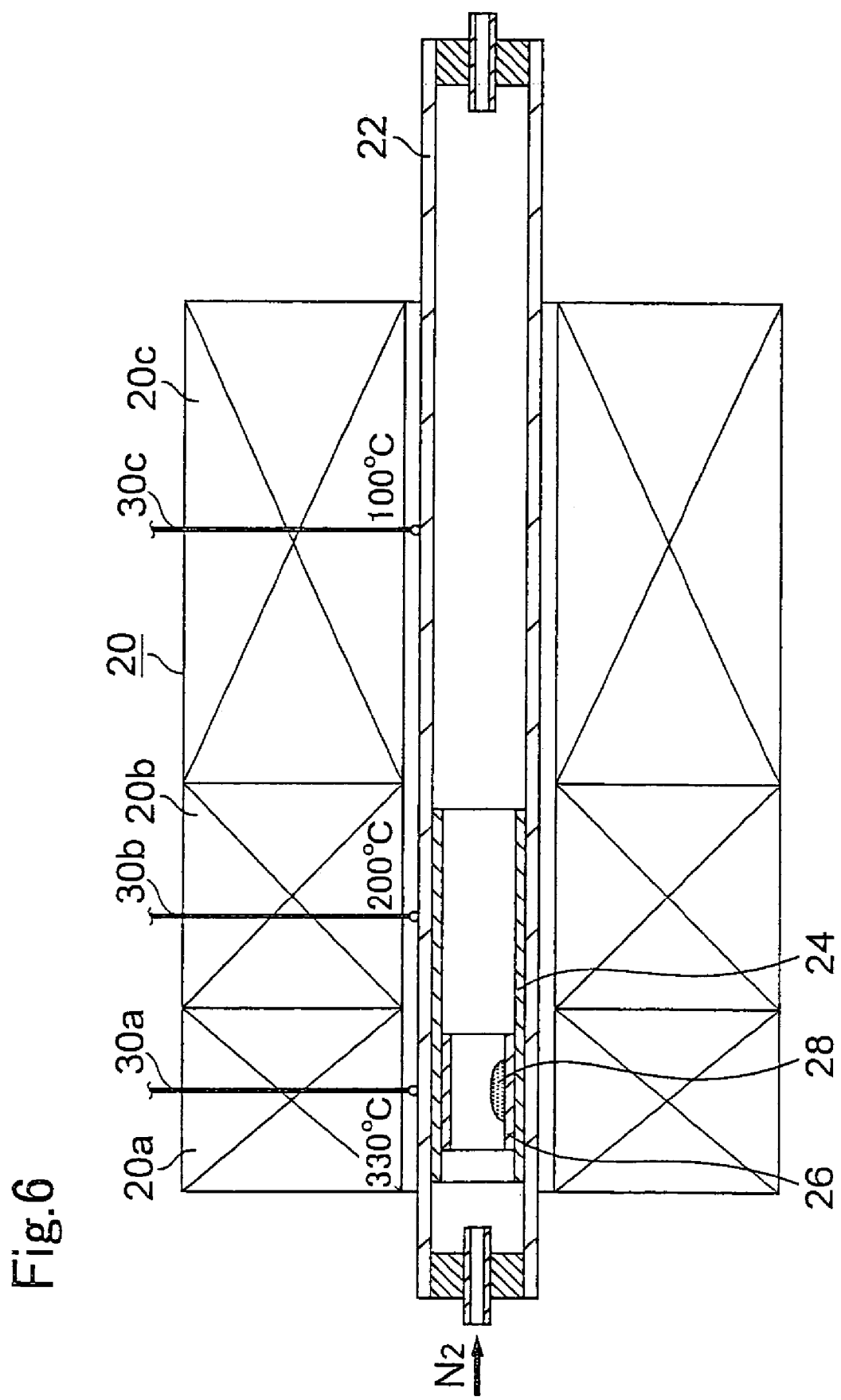

Fig.11A
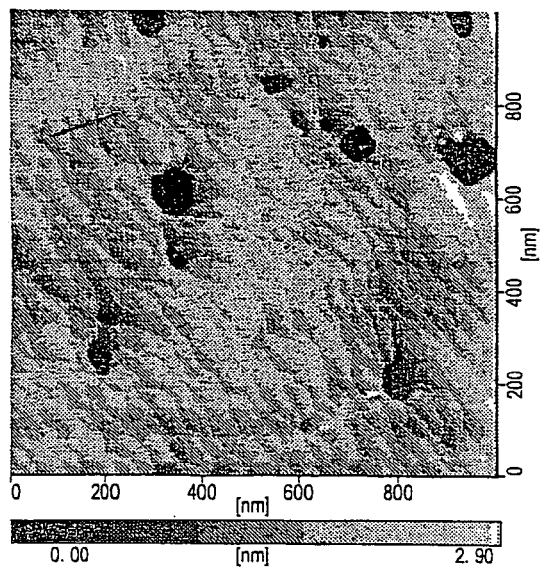
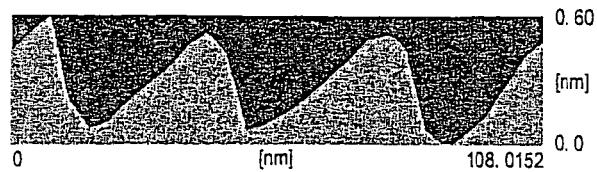
Fig.11B
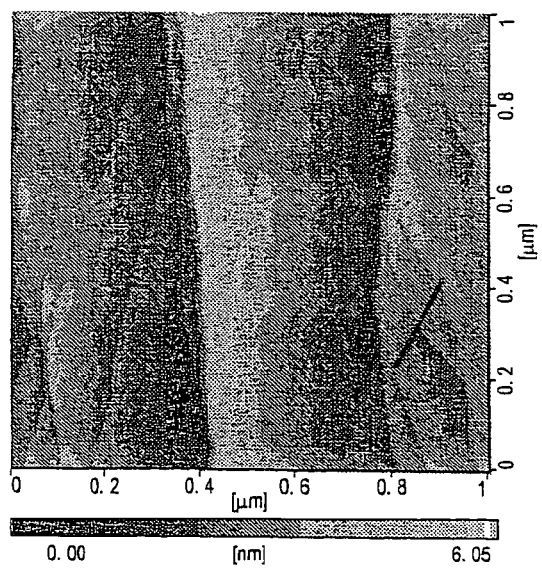
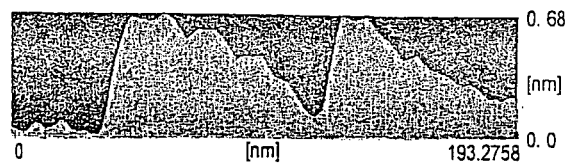

NTCDA molecule

US 7,294,780 B2

PHOTOELECTRIC CURRENT MULTIPLIER USING MOLECULAR CRYSTAL AND PRODUCTION METHOD THEREFOR

This is a divisional of application Ser. No. 10/490,476, filed Mar. 24, 2004 now U.S. Pat. No. 7,220,986, the entire contents of which is hereby incorporated by reference.

The present application claims priority based on Japanese Patent Applications: 2001-301575, filed Sep. 28, 2001 and 2002-027437, filed Feb. 4, 2002, the entire contents of which is hereby incorporated by reference.

TECHNICAL FIELD

The present invention relates to an organic photo-electronics apparatus, and specifically, to a photoelectric current multiplier including a photoelectric current multiplier device which utilizes a photoelectric current multiplication phenomenon at the organic/metallic interface caused by a photoconductive organic semiconductor, and a light-to-light transducer further equipped with an organic electroluminescent (organic EL) layer for obtaining light-to-light transduced light, and a production method thereof.

The photoelectric current multiplier is applicable to a photo sensor and the like.

DESCRIPTION OF THE RELATED ART

Conventionally, a photoelectric current multiplier utilizing such a multiplication effect of photoelectric current at the organic/metallic interface had a sandwich-type cell structure in which a vapor-deposited thin film formed of an organic semiconductor is sandwiched between two metallic electrodes. As a specific example, there are known those adopting a vapor-deposited thin film formed of metal-substituted phthalocyanine (Me-PTC) and of a perylene pigment as an organic semiconductor (See for example, M. Hiramoto, T. Imahigashi, and M. Yokoyama, Applied Physics Letters. 64, 187 (1994)), those adopting a vapor-deposited thin film of naphthalene tetracarboxylic anhydride (NTCDA) which is a naphthalene derivative (See for example, T. Katsume, M. Hiramoto, and M. Yokoyama, Applied Physics Letters. 69, 3722 (1996)) and the like.

The aforementioned conventional photoelectric current multiplier device based on the vapor-deposited thin film has a multiplication factor (ratio of number of electrons by the multiplied photoelectric current flowing in the device, relative to the number of incident photons) reaching $10^5$-fold, and hence provides light detectability which is comparable to that of a photoelectron multiplier currently used for light detection. Therefore, the aforementioned conventional photoelectric current multiplier has sufficient potentiality as a light sensing device.

This multiplication phenomenon occurs by tunneling injection of electrons from the metal of electrode, induced by accumulation of light generation holes to the organic/metallic interface, as shown in the energy state chart of FIG. 1. In FIG. 1, the vertical axis represents electron energy, the open circle denotes a hole, and the solid circle denotes an electron. In this case, NTCDA is used as the organic semiconductor and gold (Au) is used as the electrodes adjoining to the organic semiconductor.

It is already known that the organic/metallic interface trap which accumulates the holes to cause multiplication is a dead end structure (structural trap) resulting from nonuniform adherence due to incomplete joining between the organic thin film (in this case NTCDA) and the metal, as shown in the model of FIG. 2.

However, in the conventional photoelectric current multiplier which adopts a vapor-deposited thin film using an organic pigment (for example, Me-PTC which is a perylene pigment and NTCDA which is a naphthalene derivative), a time in the order of several tens of seconds is required for responding to the starting of light application (light-on) and ending of light application (light-off) of the multiplied photoelectric current, leading to the drawback that the light response of multiplied photoelectric current is very slow. This drawback has hindered application of the photoelectric current multiplier as a photo sensor.

It is an object of the present invention to increase the response speed of the photoelectric current multiplier.

DISCLOSURE OF THE INVENTION

For establishing an alternative to the conventional photoelectric current multiplier which adopts a vapor-deposited thin film of an organic pigment, the inventors of the present application attempted to use a single crystal of an organic pigment in place of the vapor-deposited thin film of an organic pigment. Precedents of a photoelectric current multiplier using a single crystal of organic pigment had not been found.

The photoelectric current multiplier of the present invention comprises electrodes for applying a voltage to a photoelectric current multiplier layer containing a photoconductive organic semiconductor, the photoconductive organic semiconductor being formed of a single crystal of an organic pigment, wherein a light irradiation-induced current can be obtained with a quantum yield multiplied by 1-fold or more by light irradiation in the condition that a voltage is applied by the electrodes, thereby realizing faster response than a vapor-deposited film formed of the same material.

In the conventional photoelectric current multiplier using a vapor-deposited thin film of an organic pigment, the photoelectric current multiplication phenomenon is known to depend largely on the condition of the organic semiconductor at the interface with the metal. For this reason, it has been impossible to predict whether photoelectric current multiplication phenomenon that was observed in a vapor-deposited thin film also occurs in a single crystal.

With regard to the multiplication phenomenon in an organic single crystal, observation has been reported once (H. Kallman and M. Pope, Proceeding of symposium on electrical conductivity in organic solids, pp. 21-25, Duke University, Durham, N.C., Apr. 20-22, 1960). However, this report described no more than a single crystal of organic material being used as the material, and did not proved the mechanism of multiplication. Therefore, this report gives no suggestion about the kinds of materials that show photoelectric current multiplication among an infinite number of organic materials. This can be acknowledged from the fact that no reports have been issued about photoelectric current multiplication using a single crystal of organic material in the 40 years since this report was published.

The significant feature of the present invention is: finding that the response becomes faster than that of the photoelectric current multiplier using a vapor-deposited film of an organic pigment, as well as confirming that photoelectric current multiplication phenomenon occurs by using a single crystal of an organic pigment as a photoconductive organic semiconductor layer.

In the case where a single crystal organic pigment is used in the photoconductive organic semiconductor layer, the degree of transfer of carriers becomes much larger than that of a vapor-deposited film due to the fact that the single crystal does not have grain boundaries, and hence it is conceivable that the response is faster.

There are also reports of a light-to-light transducer in which an organic electroluminescent (organic EL) layer is laminated and integrated to a photoelectric current multiplier layer formed by a photoconductive organic semiconductor, for converting wavelength of light and multiplying the light (See T. Katsume, M. Hiramoto, and M. Yokoyama, Appl. Phys. Lett., 64, 2546 (1994), and M. Hiramoto, T. Katsume, and M. Yokoyama, Opt. Rev., 1, 82 (1994)). The photoelectric current multiplier layer of these reports is a vapor-deposited thin film of a photoconductive organic semiconductor. However, when the photoelectric current multiplier layer is replaced with a single crystal of an organic pigment in accordance with the present invention, a light-to-light transducer can be constructed in the similar manner.

In other words, the fast responsive photoelectric current multiplier of the present invention also includes a light-to-light transducer which obtains as an output light-to-light transduced light from the organic electroluminescent layer by converting the light irradiation-induced current into light rather than obtaining light irradiation-induced current, since the organic electroluminescent layer is laminated and integrated to the photoelectric current multiplier layer and the photoelectric current multiplier layer is irradiated with light.

It is anticipated that multiplication characteristics such as multiplication factor and response speed will be desirably controlled if it is possible to flexibly control the ultrafine structure of the organic thin film. In the past, however, it was impossible to observe the structure of the organic vapor-deposited thin film, which is an assembly of fine crystals, in molecular level. For this reason, the relationship between the ultrafine structure of organic side and the structural trap was unclear, so that it was impossible to undertake the control of multiplication characteristics by controlling the ultrafine structure at the organic/metallic interface.

The inventors of the present invention succeeded in controlling the multiplication characteristics by way of controlling the structure of single crystal surface in molecular level by using a single crystal as the photoconductive organic semiconductor.

The photoelectric current multiplier device using the vapor-deposited thin film as described above is incapable of controlling the structure of the organic thin film in molecular level. However, by using an organic semiconductor single crystal, it becomes possible to control the multiplication characteristics by way of controlling the structure of crystal surface in molecular level.

Another aspect of the photoelectric current multiplier of the present invention is a photoelectric current multiplier wherein multiplication characteristics are controlled by way of controlling the structure of an organic/metallic interface created by using a single crystal of an organic semiconductor in molecular level.

According to a production method of the present invention, in producing a photoelectric current multiplier in which a light irradiation-induced current is obtained with a quantum yield multiplied by irradiating a photoelectric current multiplier layer with light in the condition that a voltage is applied to the photoelectric current multiplier layer containing a photoconductive organic semiconductor, a single crystal is adopted as the photoconductive organic semiconductor, and photoelectric current multiplication characteristics are controlled by controlling molecular step structure of the single crystal at an interface between the single crystal and the metal of electrode.

In the photoelectric current multiplier of the present invention, since the organic semiconductor layer of the photoelectric current multiplier layer is a solid single crystal, it is possible to form an electrode thin film on the organic semiconductor layer by, for example, a vapor deposition technique. As a result, in contrast to the case where an organic semiconductor vapor-deposited film is used as the photoelectric current multiplier layer, a substrate for supporting electrode layers and photoelectric current multiplier layer is no longer needed. Furthermore, there is an advantage that a variety of electrode materials can be selected at will regardless of the compatibility between an electrode material on a substrate and an organic semiconductor thin film to be deposited thereon, which is problematic in the case of vapor-deposited film.

Furthermore, since there is no need to provide a supporting substrate in contrast to the vapor-deposited film, produce of a perfectly symmetrical device is enabled.

BRIEF DESCRIPTION OF THE DRAWINGS

FIG. 3 describes chemical formulas showing several examples of photoconductive organic semiconductors used in the present invention;

FIG. 4 describes chemical formulas exemplifying a compound used as an organic electroluminescent layer and a compound used as a carrier transfer layer when the present invention is applied to a light-to-light transducer;

FIG. 6 is a schematic section view showing an apparatus for manufacturing an organic semiconductor single crystal in one embodiment;

FIG. 7A shows an NTCDA single crystal manufactured under reduced pressure condition, and FIG. 7B shows an NTCDA single crystal manufactured under atmospheric pressure condition;

FIG. 11A and FIG. 11B are views showing AFM images of the two kinds of NTCDA single crystals manufactured in the same embodiment.

FIG. 11A shows an NTCDA single crystal manufactured under reduced pressure condition, and FIG. 11B shows an NTCDA single crystal manufactured under atmospheric pressure, and in both cases, the upper image shows the surface condition of an area of about 1 µm×1 µm observed as a plane image, and the lower image shows the bumpy condition of the surface while part of the upper image is cut in the transverse direction;

BEST MODE FOR CARRYING OUT THE INVENTION

As a single crystal that can be used for an organic semiconductor layer of a photoelectric current multiplier layer, single crystals of organic semiconductors as mentioned below which exert photoelectric current multiplying function by a vapor-deposited film can be exemplified. Some of such single crystals are exemplified in FIG. 3. That is, phthalocyanine-based pigments [phtalocyanine and its derivatives (MPc having various kinds of metals in the center; $H_2Pc$ not having metals in the center, those having various kinds of substituents)], quinacridone-based, pigments (quinacridone (DQ) and its derivatives), perylene-based pigments [perylene and its derivatives (various kinds of derivatives having different substituents on the nitrogen atom are known, for example, t-BuPh-PTC, PhEt-PTC and the like, and Im-PTC having high photoelectric transducing ability)], naphthalene derivatives (wherein the perylene backbone of a perylene pigment is substituted by naphthalene, for example NTCDA) and the like. However, the single crystals of photoconductive organic semiconductor that can be utilized in the present invention are not limited to the above, and single crystals such as pentacene and its derivatives, porphyrin and its derivatives, merocyanine and its derivatives, C60 (fullerene) and the like may be used.

In constructing a light-to-light transducer, as the organic electroluminescent layer, vapor-deposited films of aluminum-quinolinol complex (Alq3) (denoted by the symbol "C20" in FIG. 4), 3,4,9,10-perylene tetracarboxylic 3,4:9, 10-bis(phenylethylimide) and the like can be exemplified.

The film thickness of the organic electroluminescent layer is appropriately from 0.05 to 0.1 μm.

The light-to-light transducer may be provided with a carrier transfer layer (a hole transfer layer or an electron transfer layer) between the organic electroluminescent layer and the electrode. Vapor-deposited films of triphenyl-diamine derivatives (TPD) such as N,N-diphenyl-N,N-bis(4-methylphenyl)-4,4-diamine (denoted by the symbol "C21" in FIG. 4), 3,5-dimethyl-3,5-ditertiary butyl-4,4-diphenoquinone, 2-(4-biphenyl)-5-(4-tertiary butylphenyl)-1,3,4-oxadiazole, N,N,N,N-tetra-(m-toluyl)-m-phenylene diamine and the like can be exemplified as the carrier transfer layer.

The film thickness of the carrier transfer layer is appropriately from 0.05 to 0.1 μm.

With regard to the electrodes, a vapor-deposited film or a sputtered film made of gold or other metal may be used besides an ITO (indium tin oxide) transparent electrode as the electrode film provided on the side where transparency is required. The electrode films can be formed by vapor-deposition or sputtering technique on the photoelectric current multiplier layer or a laminate of the photoelectric current multiplier layer and the organic electroluminescent layer.

Figure 5A:
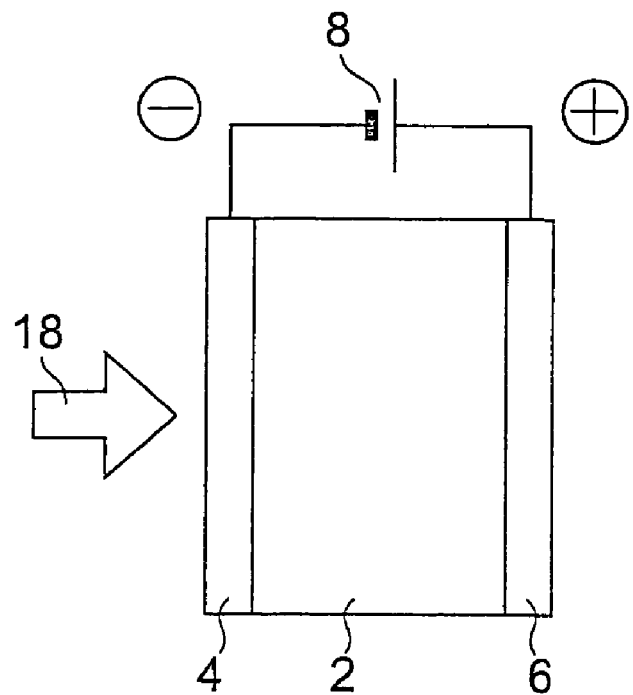
FIGS. 5A and 5B are schematic section views each showing a photoelectric current multiplier of an embodiment of the present invention.

FIG. 5A schematically shows the section of one embodiment of a photoelectric current multiplier of the present invention. On both sides of a photoconductive organic semiconductor single crystal 2 which is a photoelectric current multiplier layer, electrodes 4, 6 are formed to configure a sandwich-type cell. A DC power source 8 applies a voltage to the organic semiconductor single crystal 2 by means of the electrodes 4, 6.

As one example, an NTCDA single crystal with a thickness of 167 μm manufactured under reduced pressure condition as described later was used as the organic semiconductor single crystal 2, and an Au thin film having an thickness of 20 nm formed by vapor deposition was used as the electrodes 4, 6. As the DC power source 8, a power source capable of applying voltages of up to 1,000V to the organic semiconductor single crystal 2 was arranged.

By irradiating the organic semiconductor single crystal 2 with light 18 while a voltage from the power source 8 is applied on the organic semiconductor single crystal 2 by the electrodes 4, 6, photoelectric current multiplication occurs at the interface between the organic semiconductor single crystal 2 and the electrode 4. Multiplication factor (photoelectric current quantum yield) was calculated by dividing the number of carriers having flown as the photoelectric current by the number of photons absorbed by the organic semiconductor single crystal 2.

Figure 5B:
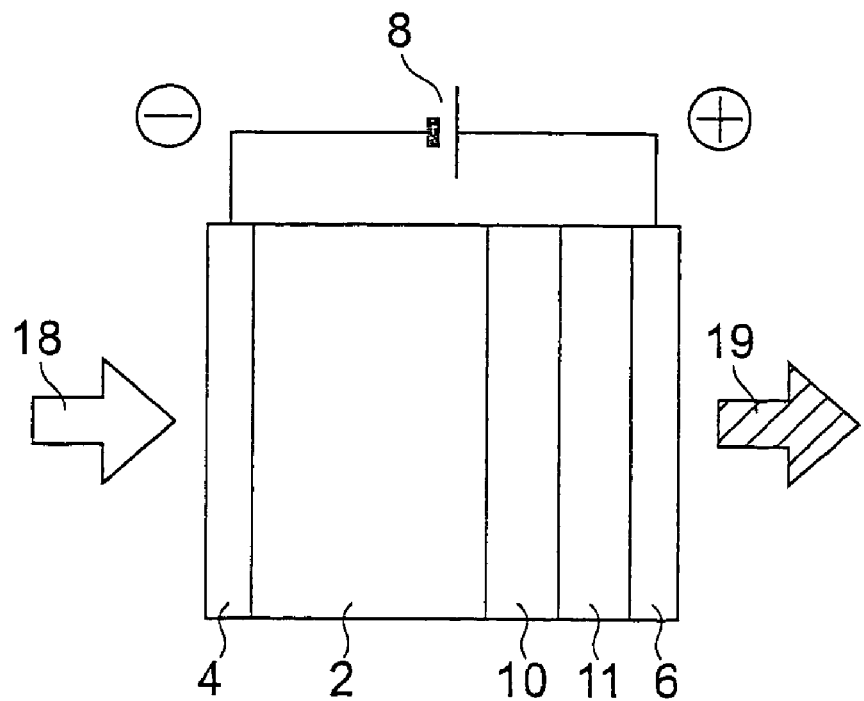

When the present invention is applied to a light-to-light transducer, an organic electroluminescent layer is laminated and integrated on the organic semiconductor single crystal 2. One example of cell structure in such a case is schematically shown in FIG. 5B. An organic electroluminescent layer 10 is laminated and integrated on the organic semiconductor single crystal 2. In this laminate, the electrode 4 is provided on the organic semiconductor single crystal 2, and the electrode 6 is provided on the organic electroluminescent layer 10 via a hole transfer layer 11. It is preferred to interpose the hole transfer layer 11 between the organic electroluminescent layer 10 and the electrode 6 as illustrated. By irradiating the organic semiconductor single crystal 2 with the light 18 while applying a voltage from the power source 8 to the laminate of the organic semiconductor single crystal 2 and the organic electroluminescent layer 10 via the hole transfer layer 11 by means of the electrodes 4, 6, light-to-light transduced light 19 having a wavelength which is different from that of the radiation light 18 from the organic electroluminescent layer 10 is generated.

In this light-to-light transducer, since the radiation light 18 is applied to the organic semiconductor single crystal 2 via the electrode 4, the electrode 4 should be permeable to the radiation light 18. Furthermore, since the light-to-light transduced light 19 is drawn out from the organic electroluminescent layer 10 via the hole transfer layer 11 and the electrode 6, the hole transfer layer 11 and the electrode 6 should be transparent to the light 19 thus generated.

The photoelectric current multipliers as described above can be manufactured by laminating each layer on the organic semiconductor single crystal 2.

The organic semiconductor single crystal was manufactured by using a crystal growing apparatus as shown in FIG. 6. This crystal growing apparatus is configured by disposing a crystal growing tube 24 in a reaction tube 22 of an electric furnace 20, and disposing a material tube 26 on the upper side in the tube 24 (left side in the drawing). In the material tube 26 is exposed organic semiconductor powder 28 as a material. The reaction tube 22, crystal growing tube 24 and material tube 26 are made of quartz glass.

It is so configured that carrier gas can flow from the upstream side of the reaction tube 20. As the carrier gas, any gases that are not reactive with the components of the organic semiconductor to be grown, as well as inert gases such as nitrogen, argon and helium can be used.

The electric furnace 20 disposed outside the reaction tube 20 consists of three electric furnaces connected so as to be divided into three areas 20a to 20c along the longitudinal direction of the reaction tube 22. The area 20a is an area where the material 28 is heated, the area 20b is a crystal growing area disposed downstream of the area 20a, and the area 20c is an area disposed downstream of the area 20b. The electric furnaces in the areas 20a to 20c are respectively provided with thermocouples 30a to 30c, to allow independent temperature control for the respective areas 20a to 20c. The temperature of the electric furnace 20 was set to have a temperature gradient decreasing toward the downstream side (right side in the drawing) from the upstream side (left side in the drawing).

As one example, an NTCDA was allowed to grow. In this case, the temperature of the electric furnace 20 was set so that it is 330° C. at the position of the thermocouple 30a, 200° C. at the position of the thermocouple 30b, and 100° C. at the position of the thermocouple 30c. NTCDA powder of the material 28 was placed at the portion of 330° C. The single crystal was precipitated in the crystal growing tube 24 having lower temperature.

In growing of the NTCDA single crystal, the single crystal was manufactured in two different flow gas pressure conditions with regard to the carrier gas. First the single crystal was manufactured in reduced pressure condition (about 1 Torr) under nitrogen flow (also referred to as reduced pressure condition), and secondly the single crystal was manufactured in one atmospheric pressure under nitrogen flow (also referred to as atmospheric pressure condition). The portion where the NTCDA single crystal precipitated had a temperature of about 240° C. in both pressure conditions.

Figure 7A:
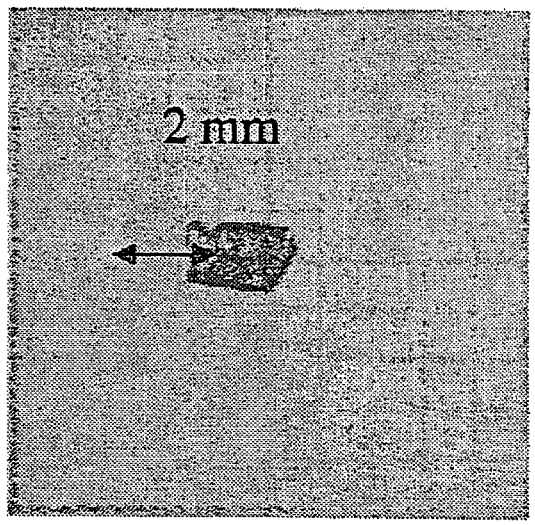
FIGS. 7A and 7B show two kinds of NTCDA single crystals manufactured in the same embodiment.

FIG. 7A shows a photograph image of the NTCDA single crystal manufactured under reduced pressure condition. This single crystal has a plate shape having a thickness of typically about 200 μm.

Figure 7B:
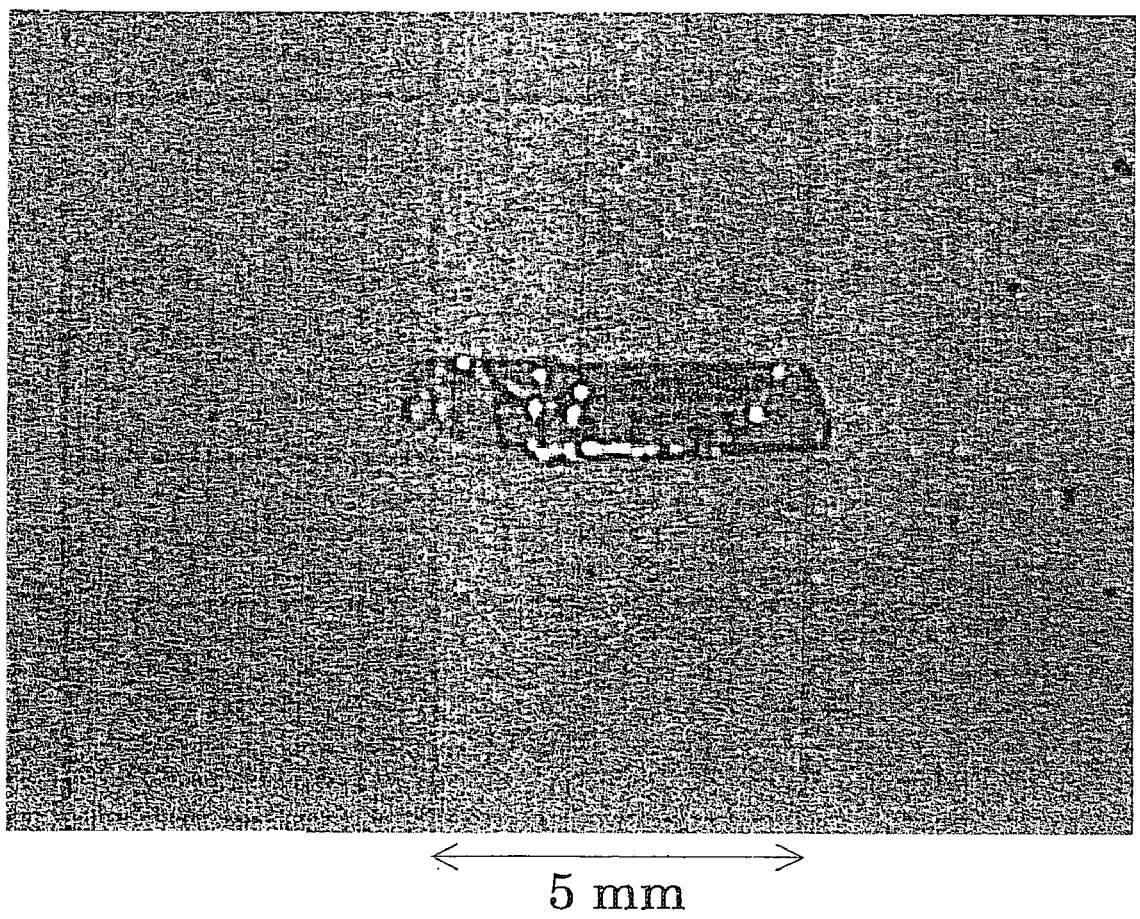

FIG. 7B shows a photograph image of the NTCDA single crystal manufactured under atmospheric pressure condition. This single crystal has an elongated plate shape having a thickness of typically 30 to 160 μm.

It was thus demonstrated that the crystal shape of single crystal differs depending on the pressure condition at the time of manufacturing.

A photoelectric current multiplier shown in FIG. 5A was configured by using these two kinds of NTCDA single crystals as a photoconductive organic semiconductor crystal. The electrodes 4, 6 are Au vapor-deposited thin films having a thickness of 20 nm. The thickness of the NTCDA single crystal manufactured under reduced pressure condition was 167 μm.

Figure 8:
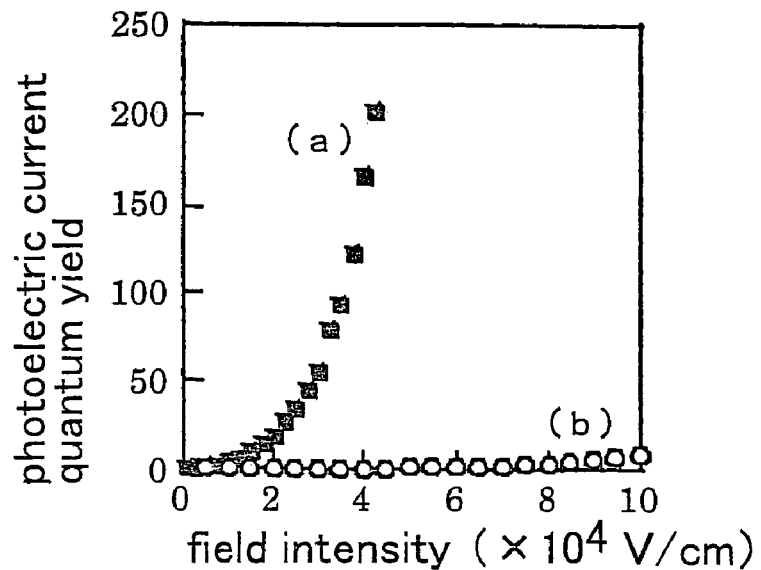
FIG. 8 shows the data of dependence on applied voltage of multiplication factor measured with regard to photoelectric current multipliers manufactured by using two kinds of NTCDA single crystals (a) and (b) produced in the same embodiment.

FIG. 8 shows dependence of the multiplication factor on applied electric field when each photoelectric current multiplier was irradiated from the side of the negative electrode 4 with a monochromatic light of 380 nm as the radiation light 18. Since the thickness differs in crystal samples, a comparison was made in the same electric field intensity condition while representing the horizontal axis by an electric field intensity which is obtained by dividing an applied voltage by a thickness of crystal. Multiplication factor (photoelectric current quantum yield) was calculated by dividing the number of carriers having flown as the photoelectric current by the number of photons absorbed by the NTCDA single crystal.

These results showed that photoelectric current multiplication phenomenon occurs in the single crystalline NTCDA. However the multiplication factor perfectly differs depending on the manufacturing condition of the crystal. That is, the single crystal manufactured under reduced pressure condition showed 200-fold multiplication factor at the electric field intensity of $4 \times 10^4$ V/cm ((a) in FIG. 8), whereas the single crystal manufactured under atmospheric pressure condition showed as small as about 10-fold multiplication factor even at the electric field intensity of $1 \times 10^5$ V/cm ((b) in FIG. 8).

Incidentally, the multiplication factor of the vapor-deposited film can easily be increased to several ten-thousands fold. This is because the vapor-deposited film has a thickness of about 500 nm in contrast to the single crystal 2 of the present embodiment having a thickness of 167 μm, so that the electric field intensity exerted on the organic semiconductor is significantly larger in the vapor-deposited film.

If a thinner single crystal is obtainable as a result of consideration of manufacturing condition of the single crystal, multiplication factor which is near to that of the vapor-deposited film will be obtained.

Figure 9:
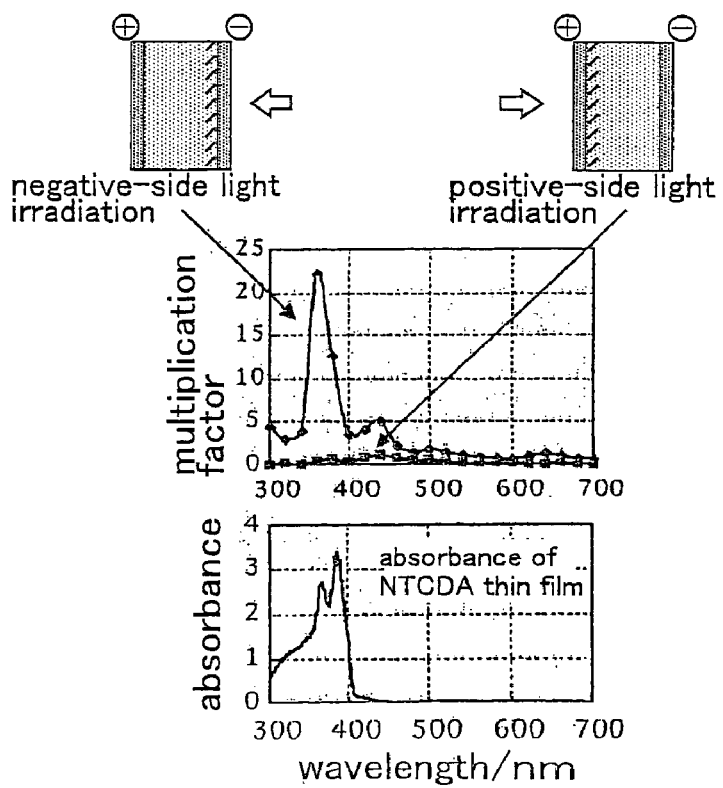
FIG. 9 are views showing wavelength-dependence of multiplication factor and absorbance spectrum of an NTCDA thin film in the same embodiment.

FIG. 9 shows wavelength-dependence of multiplication factor together with absorbance of NTCDA. When light radiation was conducted from the side of negatively-biased electrode, multiplication factor of not less than 20-fold was obtained at the absorption peak of NTCDA.

To the contrary, when light radiation was conducted from the positive side, almost no multiplication was observed. This result clearly shows that multiplication is a phenomenon occurring at the interface between the negative-side Au electrode and the crystal. This is substantially equal to the multiplication behavior of the NTCDA thin film manufactured by vacuum vapor deposition, concluding that multiplication according to the light-induced electron injection mechanism shown in FIG. 1 was observed.

As described above, since multiplication phenomenon also occurs in the NTCDA single crystal, a structural trap which causes multiplication must be present at the NTCDA crystal/Au interface.

Next, observation results of the ultrafine structure of the interface shall be described.

Figure 10:
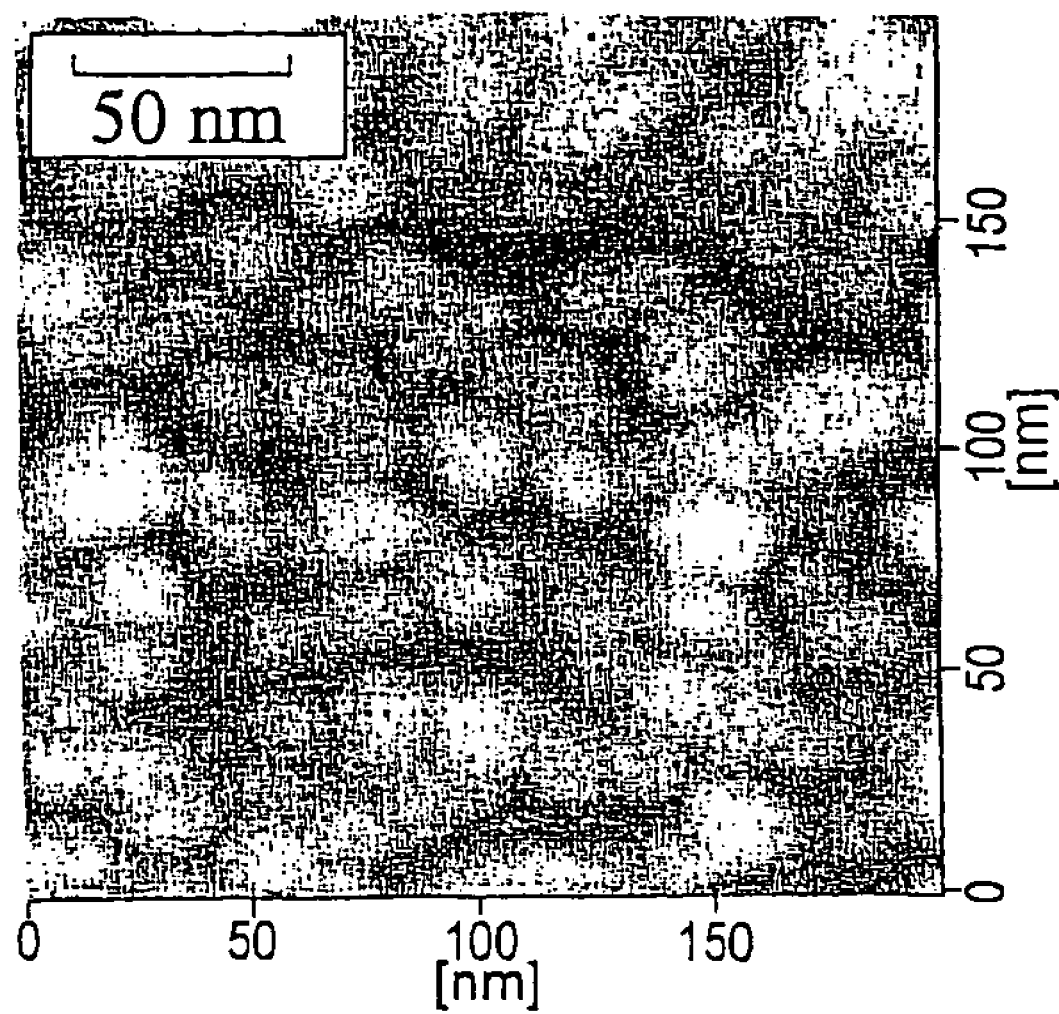
FIG. 10 is a view showing an AFM image (200 nm×200 nm) of a gold electrode which is vapor-deposited in a thickness of 20 nm on the surface of NTCDA single crystal.

FIG. 10 shows an atomic force microscope (AFM) image of the Au vapor-deposited electrode vapor-deposited on the NTCDA single crystal. It was found that Au is an assembly of ultrafine particles of about 20 nm in diameter. Since Au particles have a spherical shape, there is a spatial gap at the interface between the single crystal and Au.

FIGS. 11A and 11B show atomic force microscope (AFM) images of surface of the respective single crystals. FIG. 11A shows the NTCDA single crystal manufactured under reduced pressure condition, and FIG. 11B shows the NTCDA single crystal manufactured under atmospheric pressure condition. Upper image of each Figure shows the surface condition of about 1 μm×1 μm area observed in a plane image. Lower image of each Figure shows a section view of part of the above image cut in the transverse direction and shows the bumpy condition of the surface. FIGS. 11A and 11B are given in different units on the horizontal axis as FIG. 11A illustrates a range of a little over 100 nm and FIG. 11B illustrates a range of a little under 200 nm.

As shown in FIG. 11A, many step structures were observed on the surface of the single crystal manufactured under reduced pressure condition, and the step difference of each step was about 0.5 nm which is a width of the NTCDA molecule. This step structure is called a molecular step structure. To the contrary, as shown in FIG. 11B, the surface of the single crystal manufactured under atmospheric pressure condition was far flat, and although lines indicating the molecular steps having a step difference of 0.5 nm are observed, the number of lines is much smaller than that observed in the single crystal sample manufactured under reduced pressure condition. That is, it demonstrates that the surface of the single crystal exhibiting large multiplication has a great number of molecular step structures, and the surface of the single crystal exhibiting almost no multiplication has a small number of molecular step structures.

From these observations, existence of a great number of molecular steps in which molecular surface gets disconnected became clear as a higher dimensional structure which is larger than the molecular arrangement. Up to now, observation of such ultrafine structure in a vapor-deposited film was completely impossible, and has never succeeded. This is first enabled by using a single crystal.

Figure 1:
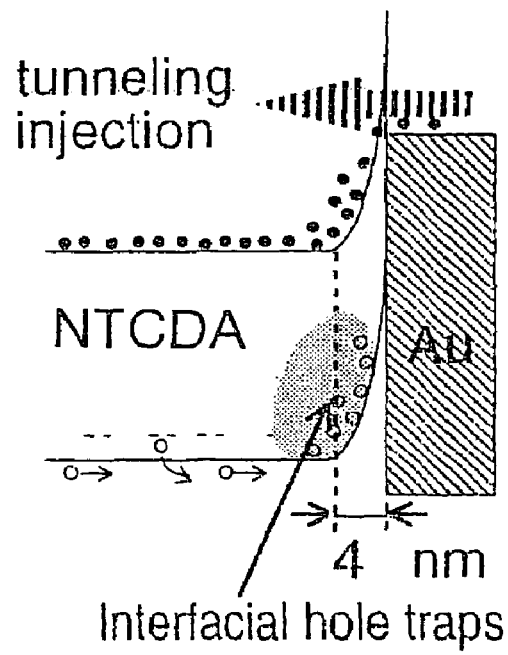
FIG. 1 is an energy structure view at an NTCDA/Au interface at the time of multiplication.

The mechanism of multiplication phenomenon in single crystal is substantially equal to the multiplication behavior of the NTCDA thin film manufactured by vacuum vapor deposition, and as explained with reference to FIG. 1, it is based on the light-induced electron injection mechanism.

Figure 12:
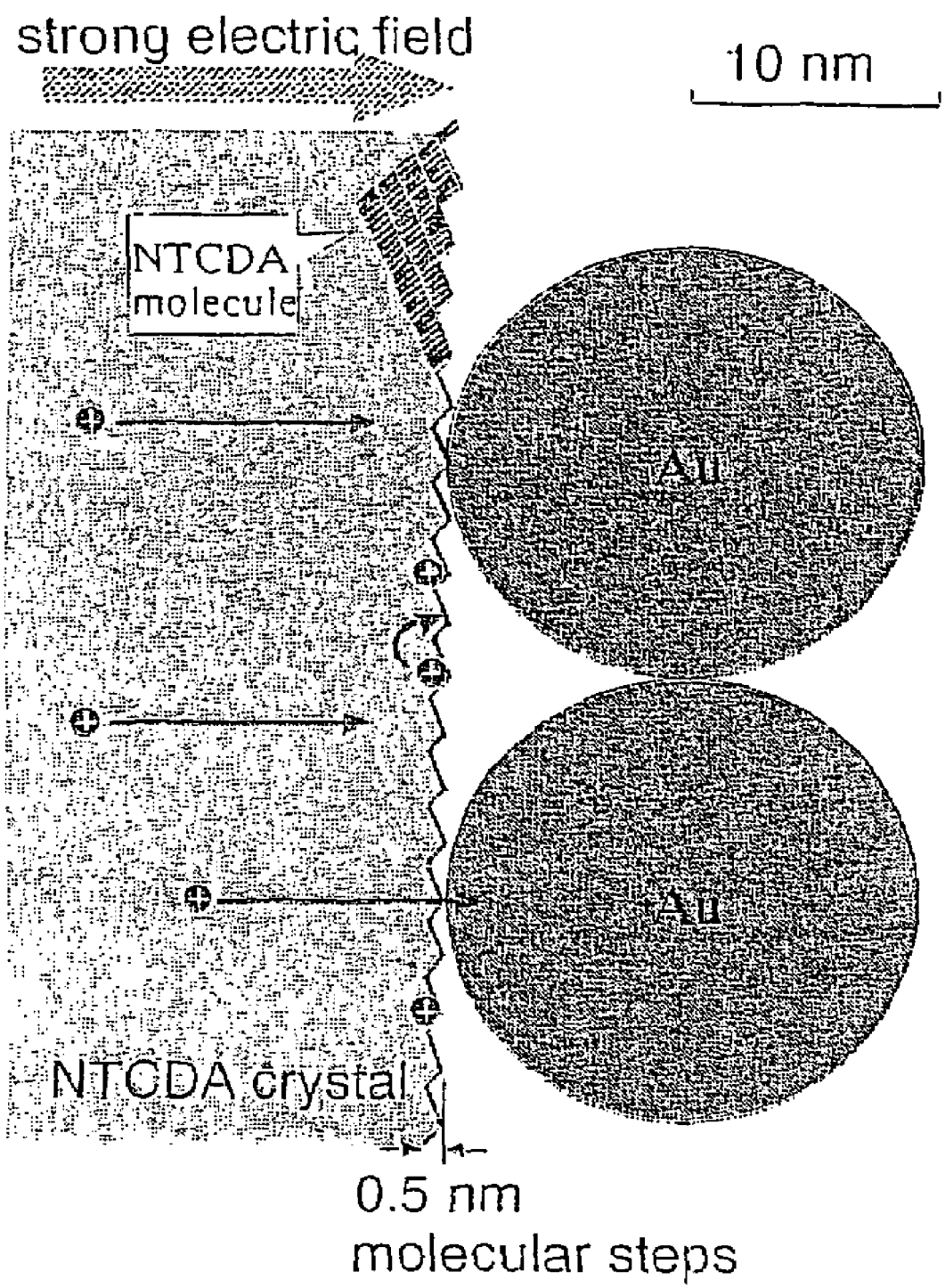
FIG. 12 is a view showing a molecular dead-end road model in the same embodiment.

FIG. 12 shows the structure of molecular level at the interface between the NTCDA crystal and Au in actual scale. The line segment on the upper right represents 10 nm, and the arrangement of short line segments depicted on the upper right portion of the crystal shows the arrangement of NTCDA molecules, and each line segment represents an NTCDA molecule. The ball on the right side (depicted by circle) represents an Au nanoparticle.

It has already been found from AFM observation that the Au vapor-deposited electrode is an assembly of ultrafine particles, and there is a spatial gap between the Au spherical particle of about 20 nm in diameter and the surface of the NTCDA crystal. And the molecular steps of about 0.5 nm form a number of dead-end roads. Strong electric field concentrates at the interface when multiplication occurs, and holes need to counter the electric field for going out of the molecular dead-end road (arrow in the vicinity of the center of the drawing). Consequently, the holes become hard to escape to the Au electrode and accumulate to cause multiplication.

Figure 13:
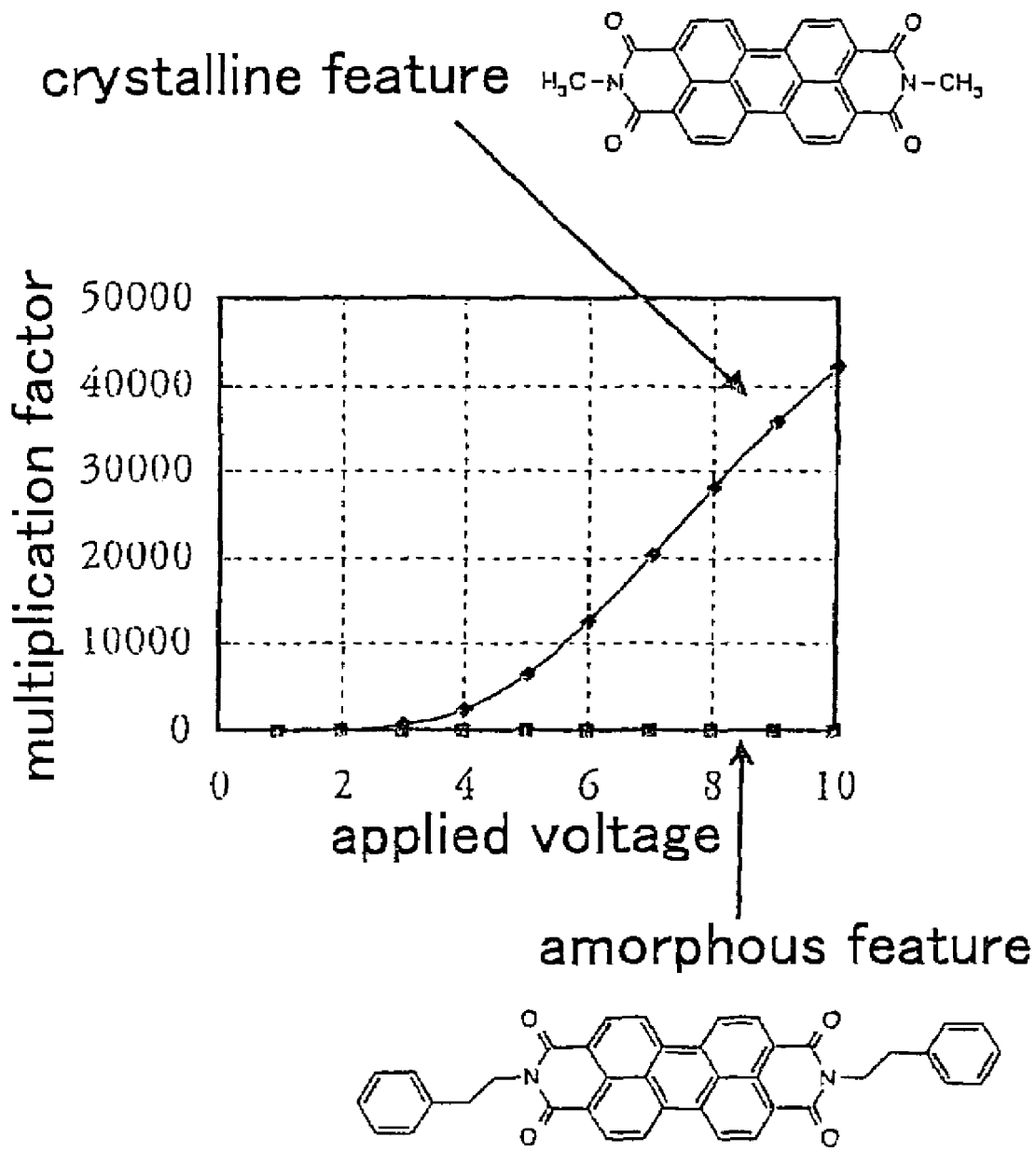
FIG. 13 is a graph showing dependence on applied voltage of multiplication factor exhibited by the crystalline Me-PTC vapor-deposition thin film and an amorphous PhEt-PTC vapor-deposition thin film.

There is a clear relationship between crystallinity and multiplication behavior of an organic vapor-deposited thin film. However explanation for this experimental evidence had not been given. FIG. 13 shows dependences on applied voltage of multiplication factor exhibited by the crystalline vapor-deposited thin film (Me-PTC) and the amorphous vapor-deposited thin film (PhEt-PTC). The crystalline thin film exhibits large multiplication, while the amorphous thin film exhibits almost no multiplication. This relationship is established in all organic thin films examined by the inventors without exception. By way of the molecular dead-end model shown in FIG. 12, this fact can be reasonably explained. In other words, since there is no regular molecular arrangement and obviously no molecular step dead-end structure in the amorphous thin film, multiplication will not occur. To the contrary, since the crystalline vapor-deposited thin film is an assembly of fine crystals, there would be a larger number of molecular step dead-end structures on the microcrystal surface than in the case of the single crystal, so that large multiplication will occur. From this consideration, it can be concluded that the molecular dead-end structure shown in FIG. 12 is essential for accumulation of holes at the organic/metallic interface.

Figure 2:
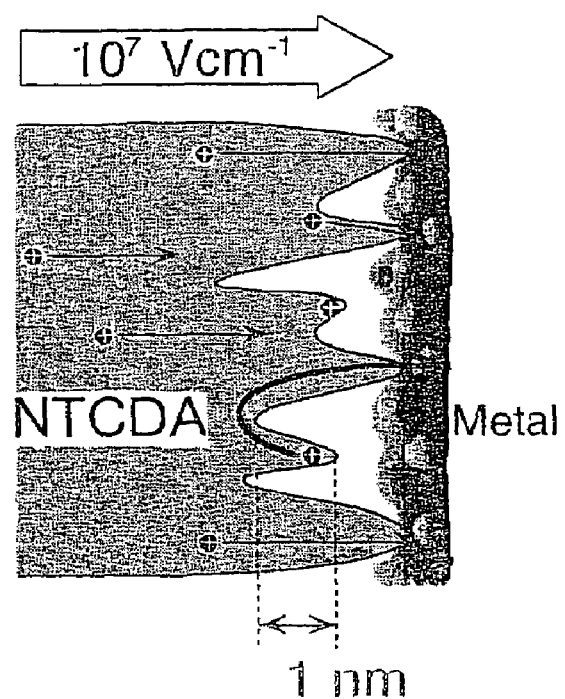
FIG. 2 is an imaginary view of a structural trap at the organic/metallic interface.

Although the structural trap model of FIG. 2 was a view perfectly drawn in the mind's eye, FIG. 12 is a view depicted based on the actual AFM observation.

The essence of structural trap is:
(i) there is a gap at an metallic/organic interface; and
(ii) there is a dead-end road-structure.

Both of these are essential for accumulation of holes at the organic/metallic interface.

From this essence of structural trap, it is clear that the larger the number of molecular step structures which are to be molecular dead-end roads, the larger multiplication is exhibited. The above experimental results (FIG. 8 and FIG. 11) directly show this fact.

This result shows that it is possible to control multiplication characteristics by controlling or even designing the molecular step structure of the organic/metallic interface.

Figure 14A:
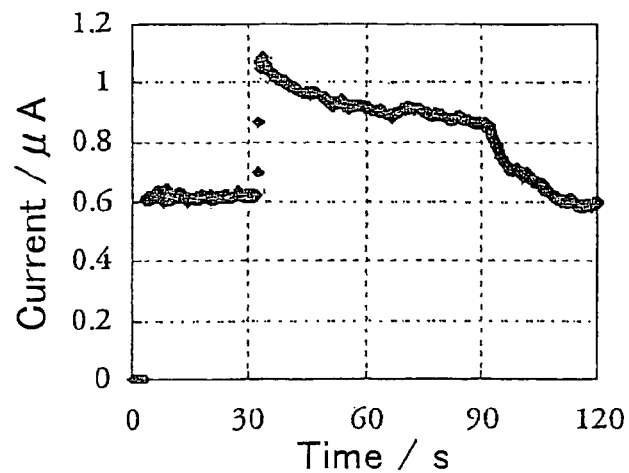
FIGS. 14A and 14B are waveform charts showing a comparison of response characteristics in the same field intensity in embodiment using NTCDA single crystal (FIG. 14A) and in comparative embodiment using NTCDA vapor-deposited film (FIG. 14B)
Figure 14B:
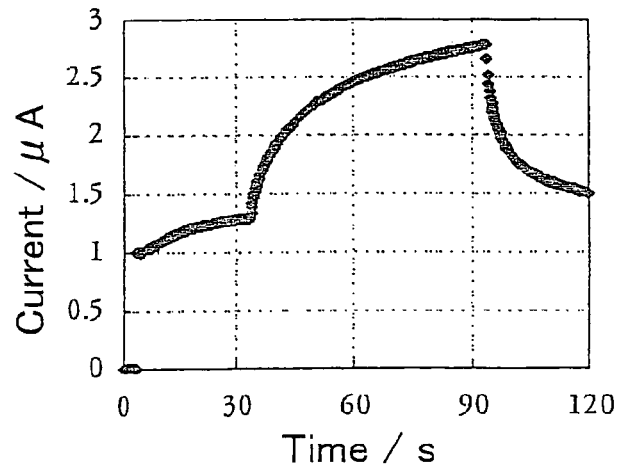

Next, faster multiplication response which is a notable characteristic of the present invention shall be explained. As one example, FIGS. 14A and 14B show a comparison of response characteristics at the same electric field intensity between the NTCDA single crystal and the vapor-deposited film. FIG. 14A shows the case where the single crystal was used, and FIG. 14B shows the case where the vapor-deposited film was used. In each graph, the vertical axis represents electric current ($\mu A$) and the horizontal axis represents time (sec.). It can be seen that the leading edge at the time of light-on is significantly sharper in the case where the single crystal was used than the case where the vapor-deposited film was used. This shows that the single crystal makes the response faster regardless of the associated disadvantage condition that the thickness of photoelectric current multiplier layer is much larger than that of the vapor-deposited film. This may result from the fact that the degree of carrier transfer of the single crystal is larger than that of the vapor-deposited film.

As described above, use of an organic semiconductor single crystal enables flexible control of multiplication characteristics via control of the density of molecular steps.

As methods of controlling the molecular step density, the following methods can be exemplified.

(1) Method of controlling the single crystal manufacturing condition as shown in the above embodiments.

(2) Method of vapor-depositing the same organic semiconductor on the organic semiconductor single crystal while controlling the temperature of substrate, to allow epitaxial growth. In this case, since the same molecules are used, the problem of lattice mismatch will not occur and control of structure is relatively easy. When this method is conducted using a molecular beam epitaxial (MBE) apparatus, more accurate control, such as control of a monomolecular layer can be realized.

(3) Method of cutting at various angles using a microtome. Since the step density differs depending on the crystal surface, it is possible to create a variety of exposed crystal surfaces so that the step density can be controlled by cutting at various angles using a microtome.

(4) Method of heat treating the single crystal. Also by heat treatment of the single crystal, it is possible to control the step density.

(5) Method of directly processing the surface of the single crystal by using AFM probe.

(6) Method of processing the surface of the single crystal by ion bombardment.

(7) Method of processing the single crystal by etching with an organic solvent or vapor of organic solvent.

Next, an embodiment of the above mentioned method (2) shall be explained.

On a substrate of NTCDA single crystal which was manufactured under atmospheric pressure condition and showed little multiplication in the above embodiment, NTCDA was vapor-deposited at room temperature in thickness of 30 nm, to prepare a sample.

Figure 15:
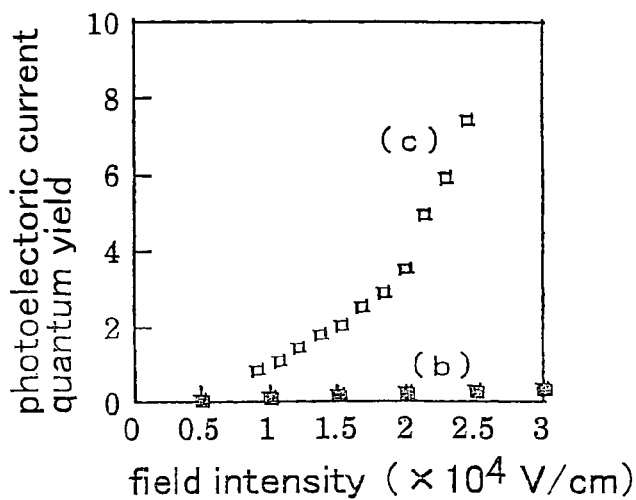
FIG. 15 is a view showing dependence on applied voltage of multiplication factor exhibited by the photoelectric current multiplier created using an NTCDA single crystal manufacture in other embodiment, wherein (c) uses a sample in which NTCDA is vapor-deposited on the surface of NTCDA single crystal substrate by the same embodiment, and (b) uses an NTCDA single crystal manufactured under atmospheric pressure condition.

In FIG. 15, (c) is the dependence on applied voltage of multiplication factor exhibited by a device that is produced by using the sample wherein NTCDA is vapor-deposited on the surface of the NTCDA single crystal substrate in this manner. Also in FIG. 15, (b) is, likewise shown as (b) in FIG. 8, dependence on applied voltage of multiplication factor exhibited by a device that is produced by using the NTCDA single crystal manufactured under atmospheric pressure condition. In comparing the results of (b) and (c), the multiplication factor of (c) is clearly larger than that of (b).

Figure 16:
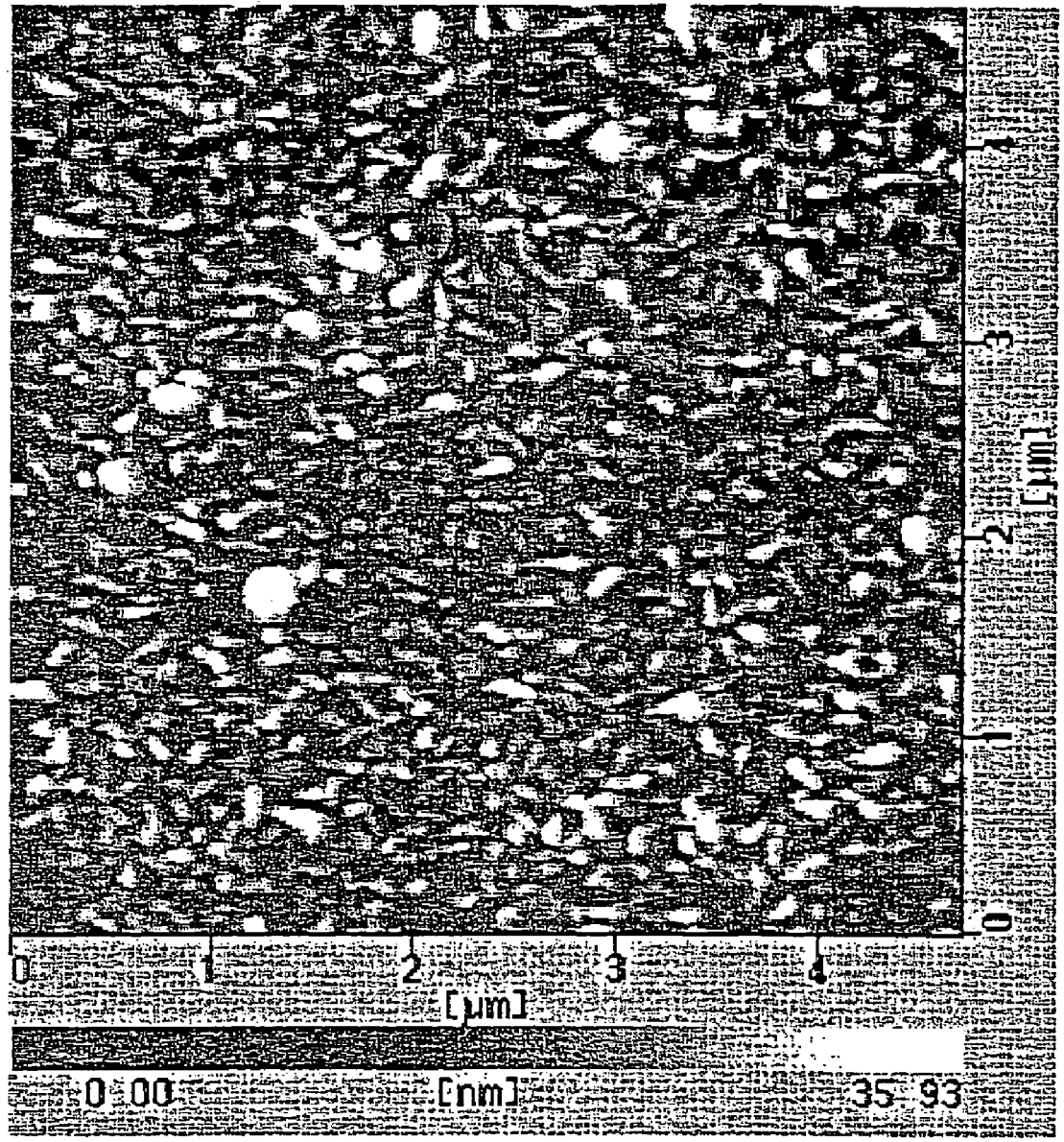
FIG. 16 is a view showing an AFM image of the surface of the sample wherein NTCDA is vapor-deposited on the NTCDA single crystal substrate manufactured under atmospheric pressure condition.

FIG. 16 shows an AFM image of the surface of the above sample which is obtained by vapor-depositing NTCDA on the substrate of NTCDA single crystal manufactured under atmospheric pressure condition at room temperature so as to have a thickness of 30 nm. Fine crystals of NTCDA generated by vapor-deposition can be observed, and more molecular steps are possessed compared to the flat single crystal surface shown in FIG. 11(b).

Figure 17A:
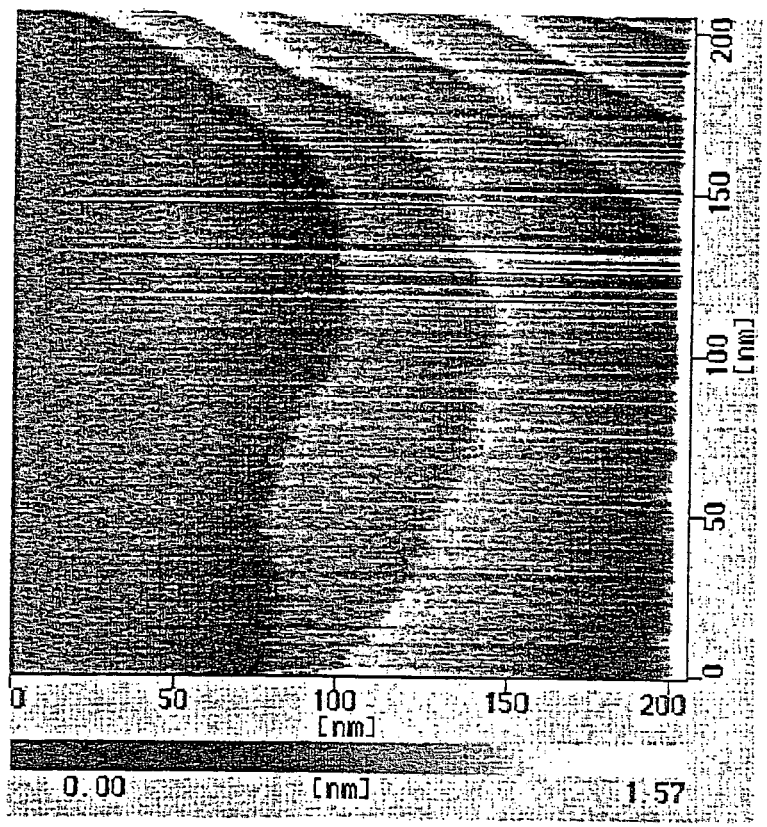
FIG. 17A is a view showing an AFM image of 200 nm×200 nm on the surface of an NTCDA single crystal.

The molecular steps on the surface of the NTCDA single crystal contain not only straight lines but also curved portions as shown in FIG. 17A. FIG. 17A shows an AFM image of 200 nm×200 nm area on the surface. By gradually enlarging such a curved portion, an image of molecular crystal shown in FIG. 17B appears. Those denoted by short parallel line segments in FIG. 17B are NTCDA molecular crystals, and have a size corresponding to that of the NTCDA molecule schematically shown in FIG. 17C.

Figure 17B:
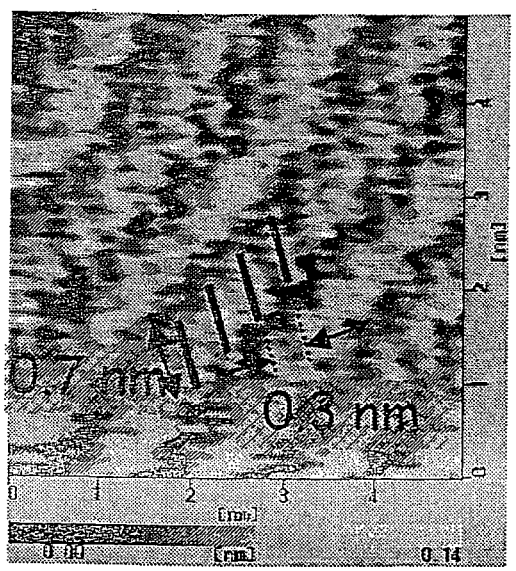
FIG. 17B is an enlarged view in which the kinking part of FIG. 17A is marked.
Figure 17C:
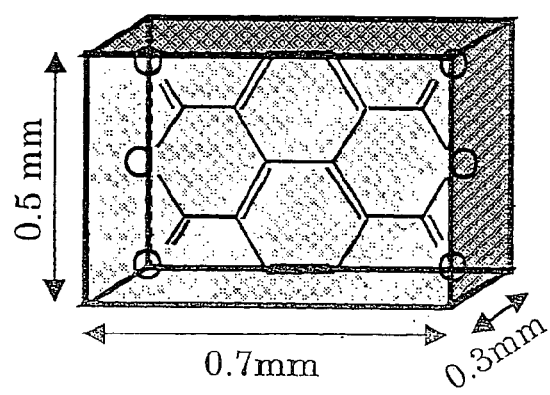
FIG. 17C is a view schematically showing the size of an NTCDA molecule.

FIG. 17B is an enlarged view of a part of FIG. 17A in the same direction. However, the direction of arrangement of molecular steps in FIG. 17A and the direction of arrangement of NTCDA molecular crystals in FIG. 17B do not coincide. This is because there are many kinking portions where the arrangement of NTCDA molecular crystals as shown in FIG. 17B bends, and hence when viewing a larger range as shown in FIG. 17A, the arrangement directions of molecular steps are bent. Also the possibility that such kinking portion plays an important role in capturing holes, namely, the possibility that holes are trapped as if they get tangled on the kinking portion can be considered. Ultimately, it is possible to control multiplication characteristics by controlling not only steps but also such kinking structure.

The single crystal of the organic semiconductor used in the present invention may be generally applied to any organic semiconductors capable of manufacturing single crystals, as well as NTCDA exemplified in the embodiment.

Although only multiplication factor is shown as multiplication characteristics in the embodiment, response speed of multiplication may be controlled by controlling the molecular step structure at interface.

As described above, according to the present invention, since a single crystal of an organic pigment was used as a photoconductive organic semiconductor in a photoelectric current multiplier which obtains a light irradiation-induced current or light-to-light transduced light with multiplied quantum yield by irradiating a photoelectric current multiplier layer with light while a voltage is applied to the photoelectric current multiplier layer containing a photoconductive organic semiconductor, it is possible to achieve the effect of improving the response speed.

As described above, according to the present invention, since photoelectric current multiplying characteristics are controlled via control of molecular step structure on the surface of the organic semiconductor single crystal used in the photoelectric current multiplier, it is possible to realize a photoelectric current multiplier of molecular crystal having an unprecedented characteristics or desired characteristics.

INDUSTRIAL APPLICABILITY

The photoelectric current multiplier according to the present invention can be used as a light detection device, and is especially suited for detecting weak light. The light-to-light transducer is suited for use in the fields that require wavelength conversion of light. Therefore, the present invention finds its application in wide fields such as optical sensors, optical computers, displays and the like.

What is claimed is:

1. A method for producing a photoelectric current multiplier containing a photoconductive organic semiconductor in which a light irradiation-induced current is obtained with a quantum yield multiplied by irradiating a photoelectric current multiplier layer with light under the condition that a voltage is applied to the photoelectric current multiplier layer, wherein
    a single crystal is used as the photoconductive organic semiconductor, and
    photoelectric current multiplication characteristics of the photoelectric current multiplier are controlled by controlling molecular step structure of the single crystal at an interface between the single crystal and metal of electrode.

2. The method for producing a photoelectric current multiplier according to claim 1, wherein
    the single crystal is manufactured by evaporation through heating and then cooling under flow of carrier gas, and
    the photoelectric current multiplication characteristics are controlled through controlling the molecular step structure by controlling the atmospheric pressure at the time of the manufacturing.

3. The method for producing a photoelectric current multiplier according to claim 1, wherein
    the photoelectric current multiplication characteristics are controlled by controlling the molecular step structure by allowing the same organic semiconductor to epitaxial-grow on the organic semiconductor single crystal.

4. The method for producing a photoelectric current multiplier according to claim 1, wherein
    the photoelectric current multiplication characteristics are controlled by controlling the molecular step structure by an angle cutting the surface of organic semiconductor single crystal using a microtome.

5. The method for producing a photoelectric current multiplier according to claim 1, wherein
    the photoelectric current multiplication characteristics are controlled by controlling the molecular step structure by conducting heat treatment of the organic semiconductor single crystal.

6. The method for producing a photoelectric current multiplier according to claim 1, wherein
    the photoelectric current multiplication characteristics are controlled by controlling the molecular step structure by directly processing the surface of the organic semiconductor single crystal using an AFM probe.

7. The method for producing a photoelectric current multiplier according to claim 1, wherein
    the photoelectric current multiplication characteristics are controlled by controlling the molecular step structure by processing the surface of the organic semiconductor single crystal by ion bombardment.

8. The method for producing a photoelectric current multiplier according to claim 1, wherein
    the photoelectric current multiplication characteristics are controlled by controlling the molecular step structure by processing the surface of the organic semiconductor single crystal by etching with an organic solvent or vapor of organic solvent.

* * * * *